(12) United States Patent
Schwab et al.

(10) Patent No.: US 7,750,449 B2
(45) Date of Patent: Jul. 6, 2010

(54) PACKAGED SEMICONDUCTOR COMPONENTS HAVING SUBSTANTIALLY RIGID SUPPORT MEMBERS AND METHODS OF PACKAGING SEMICONDUCTOR COMPONENTS

(75) Inventors: Matt E. Schwab, Boise, ID (US); J. Michael Brooks, Caldwell, ID (US); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 258 days.

(21) Appl. No.: 11/685,502

(22) Filed: Mar. 13, 2007

(65) Prior Publication Data

US 2008/0224291 A1    Sep. 18, 2008

(51) Int. Cl.
*H01L 23/02* (2006.01)
(52) U.S. Cl. .................. 257/678; 257/728; 257/753; 257/E23.063
(58) Field of Classification Search ................ 257/678, 257/687, 704, 728, 737, 753, 780, 787, E23.063
See application file for complete search history.

(56) References Cited

U.S. PATENT DOCUMENTS

| | | | |
|---|---|---|---|
| 5,107,328 A | 4/1992 | Kinsman | |
| 5,128,831 A | 7/1992 | Fox, III et al. | |
| 5,138,434 A | 8/1992 | Wood et al. | |
| 5,252,857 A | 10/1993 | Kane et al. | |
| 5,518,957 A | 5/1996 | Kim | |
| 5,639,695 A * | 6/1997 | Jones et al. | 438/126 |
| 5,851,845 A | 12/1998 | Wood et al. | |
| 5,866,953 A | 2/1999 | Akram et al. | |
| 5,883,426 A | 3/1999 | Tokuno et al. | |
| 5,933,713 A | 8/1999 | Farnworth | |
| 5,938,956 A | 8/1999 | Hembree et al. | |
| 5,946,553 A | 8/1999 | Wood et al. | |
| 5,986,209 A | 11/1999 | Tandy | |
| 5,989,941 A | 11/1999 | Wensel | |
| 5,990,566 A | 11/1999 | Farnworth et al. | |
| 6,004,867 A | 12/1999 | Kim et al. | |
| 6,008,070 A | 12/1999 | Farnworth | |
| 6,020,624 A | 2/2000 | Wood et al. | |
| 6,020,629 A | 2/2000 | Farnworth et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,049,125 A | 4/2000 | Brooks et al. | |
| 6,051,878 A | 4/2000 | Akram et al. | |
| 6,066,514 A | 5/2000 | King et al. | |
| 6,072,233 A | 6/2000 | Corisis et al. | |
| 6,072,236 A | 6/2000 | Akram et al. | |

(Continued)

OTHER PUBLICATIONS

Tessera's SHELLCASE® Technology Portfolio, 10 pages, <http://www.tessera.com/images/Tessera%20SHELLCASE%20RT%20Press%20Presentation.pdf>.

*Primary Examiner*—Hoai V Pham
(74) *Attorney, Agent, or Firm*—Perkins Coie LLP

(57) ABSTRACT

Packaged semiconductor components having substantially rigid support member are disclosed. The packages can include a semiconductor die and a support member proximate to the semiconductor die. The support member is at least substantially rigid. The packages can further include an adhesive between the support member and the semiconductor die and adhesively attaching the support member to the semiconductor die. The packages can also include a substrate carrying the semiconductor die and the support member attached to the semiconductor die.

15 Claims, 5 Drawing Sheets

U.S. PATENT DOCUMENTS

| | | | |
|---|---|---|---|
| 6,075,288 | A | 6/2000 | Akram |
| 6,089,920 | A | 7/2000 | Farnworth et al. |
| 6,122,171 | A | 9/2000 | Akram et al. |
| 6,124,634 | A | 9/2000 | Akram et al. |
| 6,148,509 | A | 11/2000 | Schoenfeld et al. |
| 6,153,924 | A | 11/2000 | Kinsman |
| 6,159,764 | A | 12/2000 | Kinsman et al. |
| 6,163,956 | A | 12/2000 | Corisis |
| 6,175,149 | B1 | 1/2001 | Akram |
| 6,184,465 | B1 | 2/2001 | Corisis |
| 6,187,615 | B1 | 2/2001 | Kim et al. |
| 6,208,519 | B1 | 3/2001 | Jiang et al. |
| 6,212,767 | B1 | 4/2001 | Tandy |
| 6,215,175 | B1 | 4/2001 | Kinsman |
| 6,225,689 | B1 | 5/2001 | Moden et al. |
| 6,228,548 | B1 | 5/2001 | King et al. |
| 6,228,687 | B1 | 5/2001 | Akram et al. |
| 6,235,552 | B1 | 5/2001 | Kwon et al. |
| 6,235,554 | B1 | 5/2001 | Akram et al. |
| 6,252,308 | B1 | 6/2001 | Akram et al. |
| 6,252,772 | B1 | 6/2001 | Allen |
| 6,258,623 | B1 | 7/2001 | Moden et al. |
| 6,259,153 | B1 | 7/2001 | Corisis |
| 6,261,865 | B1 | 7/2001 | Akram |
| 6,281,577 | B1 | 8/2001 | Oppermann et al. |
| 6,294,839 | B1 | 9/2001 | Mess et al. |
| 6,297,547 | B1 | 10/2001 | Akram |
| 6,303,981 | B1 | 10/2001 | Moden |
| 6,314,639 | B1 | 11/2001 | Corisis |
| 6,326,242 | B1 | 12/2001 | Brooks et al. |
| 6,326,687 | B1 | 12/2001 | Corisis |
| 6,326,697 | B1 | 12/2001 | Farnworth |
| 6,326,698 | B1 | 12/2001 | Akram |
| 6,344,976 | B1 | 2/2002 | Schoenfeld et al. |
| 6,407,381 | B1 | 6/2002 | Glenn et al. |
| 6,429,528 | B1 | 8/2002 | King et al. |
| 6,432,796 | B1 | 8/2002 | Peterson |
| 6,451,709 | B1 | 9/2002 | Hembree |
| 6,503,780 | B1 | 1/2003 | Glenn et al. |
| 6,548,376 | B2 | 4/2003 | Jiang |
| 6,552,910 | B1 | 4/2003 | Moon et al. |
| 6,560,117 | B2 | 5/2003 | Moon |
| 6,564,979 | B2 | 5/2003 | Savaria |
| 6,576,531 | B2 | 6/2003 | Peng et al. |
| 6,607,937 | B1 | 8/2003 | Corisis |
| 6,614,092 | B2 | 9/2003 | Eldridge et al. |
| 2002/0145207 | A1* | 10/2002 | Anderson et al. ............ 257/787 |
| 2004/0067603 | A1* | 4/2004 | Hagen ........................ 438/106 |
| 2007/0138605 | A1* | 6/2007 | Nam et al. ................... 257/666 |

* cited by examiner

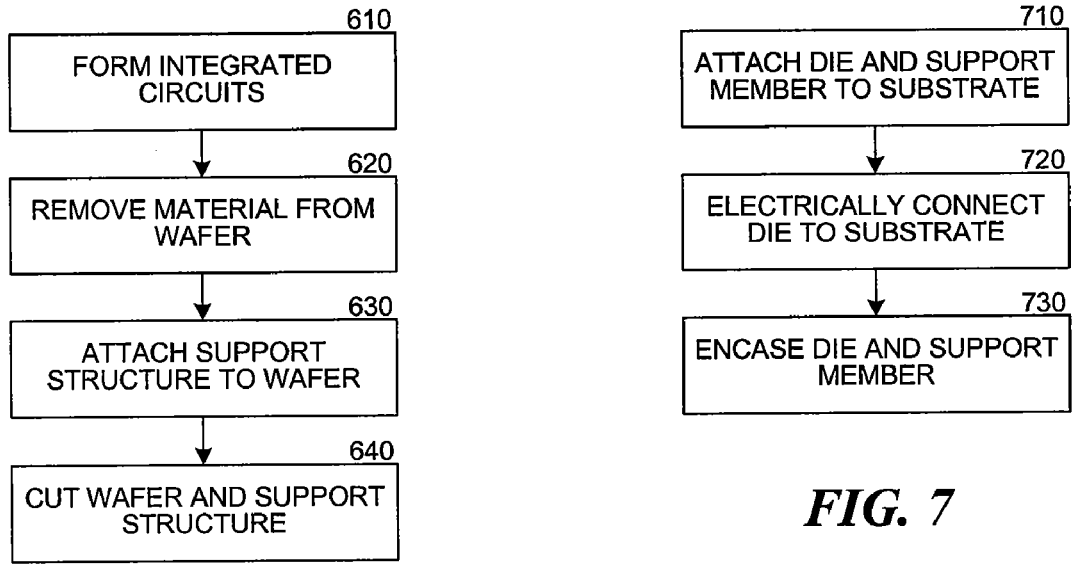
FIG. 6
FIG. 7
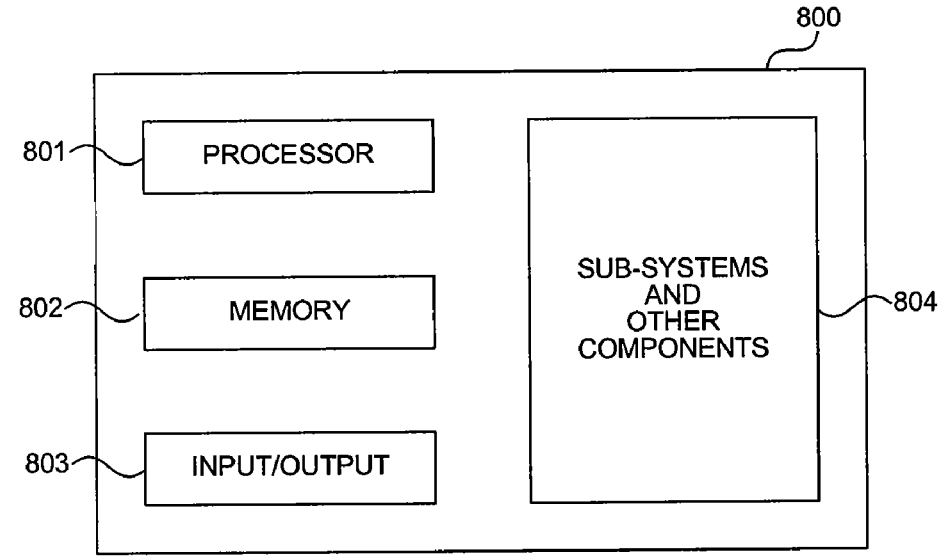
FIG. 8

PACKAGED SEMICONDUCTOR COMPONENTS HAVING SUBSTANTIALLY RIGID SUPPORT MEMBERS AND METHODS OF PACKAGING SEMICONDUCTOR COMPONENTS

TECHNICAL FIELD

The present disclosure is related to packaged semiconductor components and methods for assembling or packaging semiconductor components.

BACKGROUND

Semiconductor devices are typically manufactured on semiconductor wafers or other types of workpieces using sophisticated equipment and processes that enable reliable, high-quality manufacturing. The individual dies (e.g., devices) generally include integrated circuits and a plurality of bond-pads coupled to the integrated circuits. The bond-pads provide external contacts through which supply voltage, electrical signals, and other input/output parameters are transmitted to/from the integrated circuits. The bond-pads are usually very small, and they are typically arranged in dense arrays having a fine pitch between bond-pads. The wafers and dies can also be quite delicate. As a result, the dies are packaged to protect the dies and to connect the bond-pads to arrays of larger terminals that can be soldered to printed circuit boards.

One challenge of manufacturing semiconductor components is cost effectively packaging the dies. Electronic product manufacturers are under continuous pressure to reduce the size of their products. Accordingly, microelectronic die manufacturers seek to reduce the size of the packaged dies incorporated into the electronic products. One approach to reducing the size of packaged dies is to reduce the thickness of the dies. For example, the backside of a wafer is often ground, etched, or otherwise processed to reduce the thickness of the wafer. After being thinned, the wafer is cut to singulate the dies.

Reducing the thickness of the wafer, however, can cause several manufacturing defects. For example, as the thickness of the wafer decreases, the backside of the wafer is more likely to chip during singulation, at least partially because cracks in the wafer can more readily propagate from one surface to another surface of the wafer. Moreover, if the dies include photodiode, photogate, or other types of photo-sensing devices, then infrared radiation used during lithography processes can potentially damage these photo-sensing devices. Accordingly, there is a need to improve the processing of thinned semiconductor workpieces.

BRIEF DESCRIPTION OF THE DRAWINGS

FIG. 6 is a flow chart of a method for fabricating a packaged semiconductor component in accordance with an embodiment of the disclosure.

FIG. 7 is a flow chart of a method for fabricating a packaged semiconductor component in accordance with another embodiment of the disclosure.

FIG. 8 is a schematic view of a system that incorporates a packaged semiconductor component in accordance with embodiments of the disclosure.

DETAILED DESCRIPTION

Specific details of several embodiments of the disclosure are described below with reference to packaged semiconductor components and methods for manufacturing packaged semiconductor components. The semiconductor components are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash-memory (e.g., NAND flash-memory), processors, imagers, and other types of devices can be constructed on semiconductor wafers. Although many of the embodiments are described below with respect to semiconductor devices that have integrated circuits, other embodiments include other types of devices manufactured on other types of substrate. Moreover, several other embodiments of the invention can have different configurations, components, or procedures than those described in this section. A person of ordinary skill in the art, therefore, will accordingly understand that the invention can have other embodiments with additional elements, or the invention can have other embodiments without several of the features shown and described below with reference to FIGS. 1-8.

Figure 1:
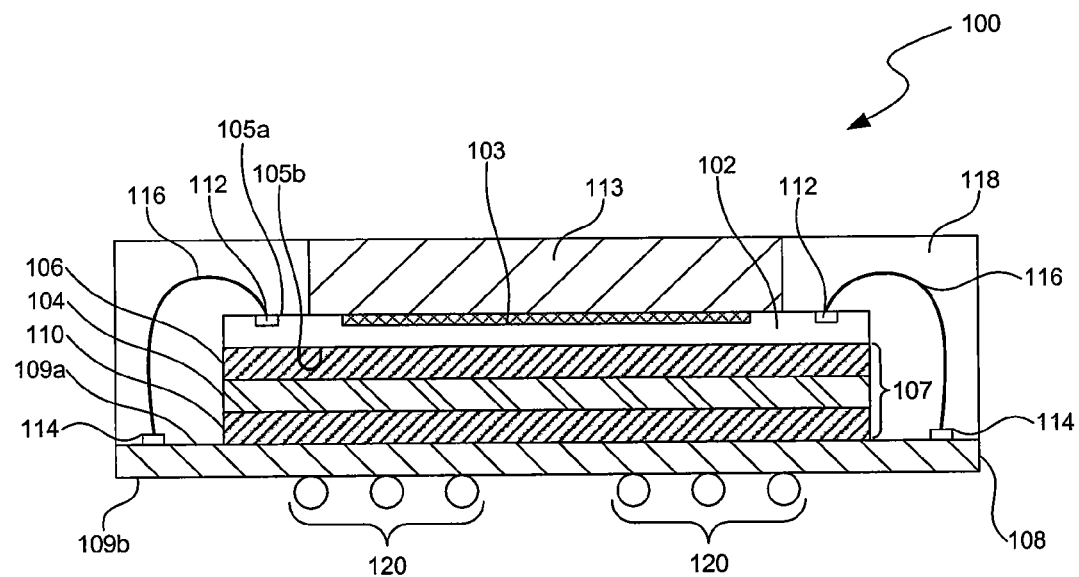
FIG. 1 is a schematic side cross-sectional view of a packaged semiconductor component in accordance with an embodiment of the disclosure.

FIG. 1 is a schematic side cross-sectional view of a packaged semiconductor component 100 in accordance with an embodiment of the disclosure. The packaged component 100 can include a semiconductor die 102 having a first surface 105*a*, a second surface 105*b*, and bond pads 112 at the first surface 105*a*. The packaged component 100 can further include a support member 104 at the second side 105*b* of the die 102, and a substrate 108 carrying the semiconductor die 102 and the support member 104. A first adhesive 106 attaches the support member 104 to the second surface 105*b* of the semiconductor die 102, and a second adhesive 110 attaches the support member 104 to the substrate 108. The packaged component 100 can also have wirebonds 116 electrically connecting the bond pads 112 of the semiconductor die 102 to connection sites 114 at the substrate 108, and an encapsulant 118 encapsulating the semiconductor die 102, the support member 104, and the wirebonds 116.

Figure 3:
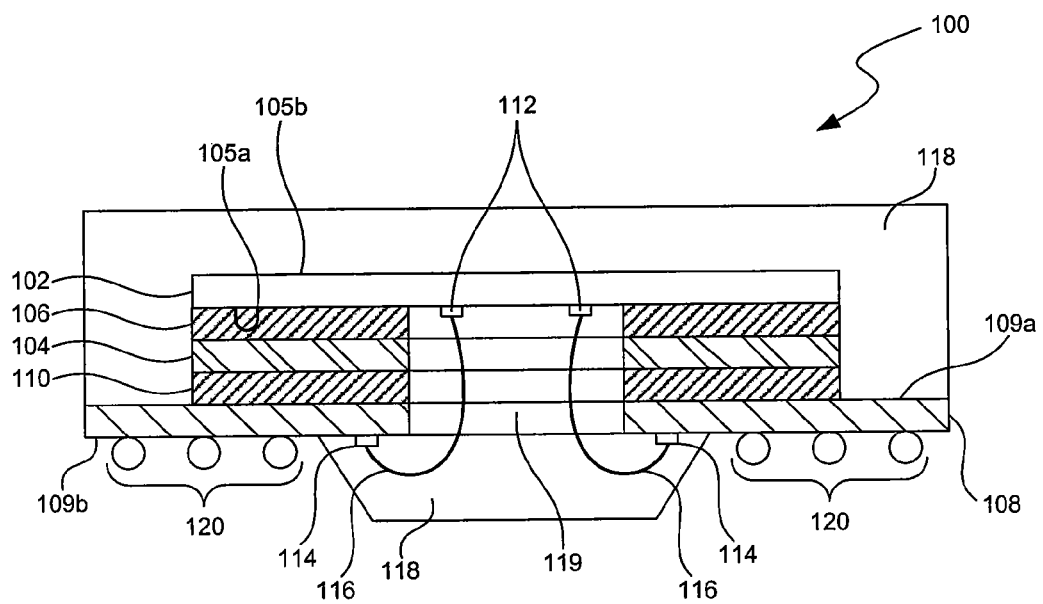
FIG. 3 is a schematic side cross-sectional view of a packaged semiconductor component in accordance with another embodiment of the disclosure.

The semiconductor die 102 can include microelectronic devices, micromechanical devices, data storage elements, optics, read/write components, and other features are fabricated. As described above. For example, SRAM, DRAM (e.g., DDR-SDRAM), flash-memory (e.g., NAND flash-memory), processors, imagers, and other types of devices can be constructed on or in the semiconductor die 102. In the embodiment shown in FIG. 1, the semiconductor die 102 can include an array of photo sensors 103 at or near the first surface 105a and a glass member 113 adjacent to the array of photo sensors 103. The illustrated embodiment of the semiconductor die 102 also includes the peripheral bond pads 112 that are proximate to the edges of the semiconductor die 102, but in other embodiments, the bond pads 112 can be positioned toward to a central region of the semiconductor die 102 (e.g., as shown in FIG. 3).

Figure 9:
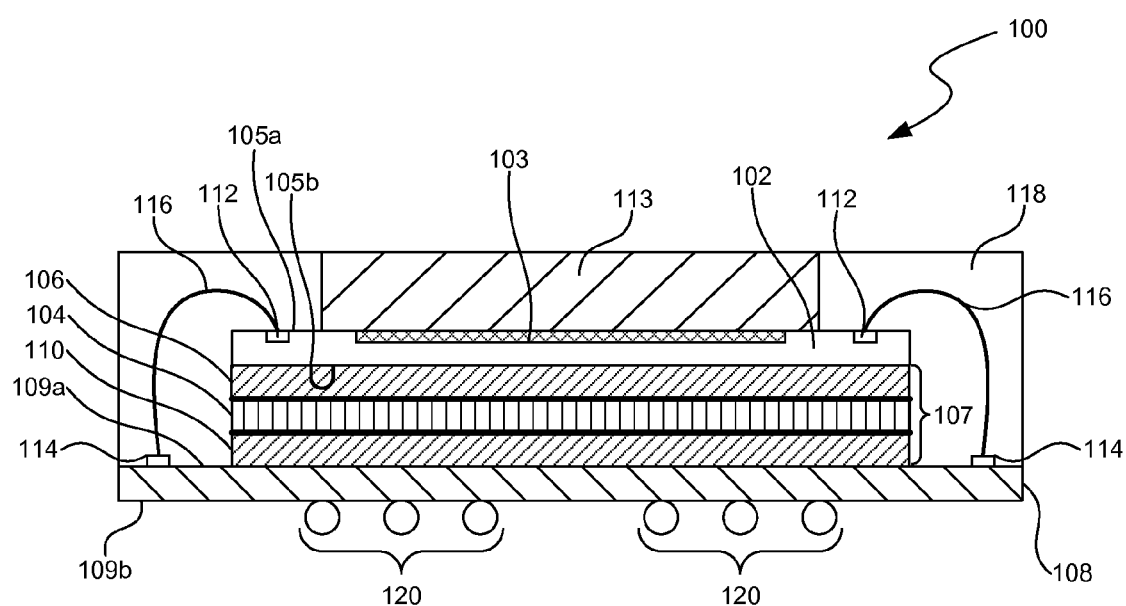
FIG. 9 is a schematic side cross-sectional view of a packaged semiconductor component in accordance with an additional embodiment of the disclosure.

The support member 104 is at least substantially rigid and can reinforce the semiconductor die 102. The support member 104 can have a composition that is different from that of the semiconductor die 102. For example, the support member 104 can be a plate constructed from a metal, a metal alloy, ceramics, polymers, glass, or other materials with sufficient mechanical strength. The support member 104 can also incorporate slots, channels, apertures, or other surface patterns. In another example, the support member 104 can be a laminated structure having a plurality of layers of different materials, of which at least one is at least substantially rigid. For example, the support member 104 can include a plurality of heat conducting fins sandwiched between two plates to provide improved heat conductance, as shown in FIG. 9. In any of these examples, the support member 104 does not include a semiconductor die.

The support member 104 can have a thickness sufficient to provide enough support to protect the semiconductor die 102 during thinning and subsequent processing but still allows easy cutting during singulation. In one embodiment, the thickness of the support member 104 is about 100 microns to about 3 mm, but in other embodiments, the thickness of the support member 104 can be outside this range.

The support member 104 can be a standalone component, or it can be combined with other components of the packaged semiconductor component 100. For example, the support member 104 can be a separate element from the first and/or second adhesives 106, 110 before assembly, or can be preformed into a die attach film 107 with the first and/or second adhesives 106, 110 before assembly. Applying the die attach film 107 can reduce complexity and manufacturing cost by reducing the number of individual processing steps.

The substrate 108 can be a printed circuit board, a silicon wafer, a glass plate, a ceramic unit, or other structure suitable for carrying the semiconductor die 102 and the support member 104. The substrate 108 can have a first surface 109a at which the connection sites 114 are positioned, and a second surface 109b with external terminals to which a plurality of solder balls 120 (six are shown for illustration purposes) are attached. The solder balls 120 are generally arranged in an array that can be surface mounted to an external device (not shown). The substrate 108 also includes internal circuits (not shown) that electrically connect the connection sites 114 at the first surface 109a to the solder balls 120 at the second surface 109b.

Figure 2A:
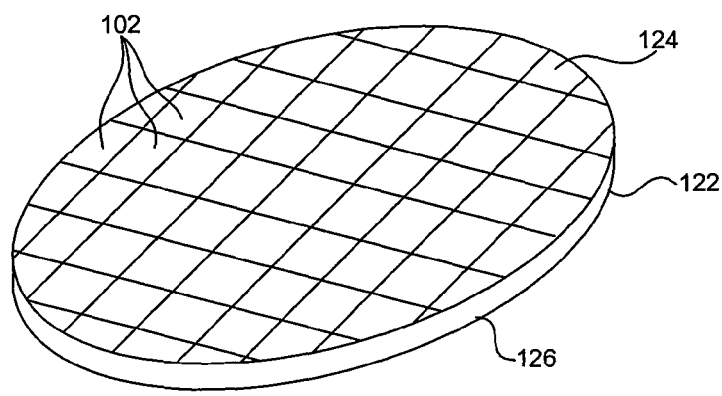
FIGS. 2A-D are perspective and cross-sectional views illustrating stages of a process for manufacturing the packaged semiconductor package of FIG. 1 in accordance with an embodiment of the disclosure.

FIG. 2A-D are perspective and cross-sectional views illustrating a number of stages of a portion of a process for manufacturing the packaged semiconductor component 100 of FIG. 1. As illustrated in FIG. 2A, integrated circuits (not shown) can be first formed in individual dies 102 on a semiconductor wafer 122 having a first wafer surface 124 and a second wafer surface 126 opposite the first wafer surface 124. For example, the array of photo sensors 103 (FIG. 1) or other types of electrical, optical, or mechanical devices can be formed in or on the first wafer surface 124 of the semiconductor wafer 122. The semiconductor wafer 122 is thinned after fabricating the dies 102 by removing material from the second wafer surface 126 via mechanical grinding, chemical-mechanical polishing, wet etching, dry chemical etching, or other suitable processes. The semiconductor wafer 122 can be thinned to be less than, for example, about 700 microns.

Figure 2B:
Figure 2C:
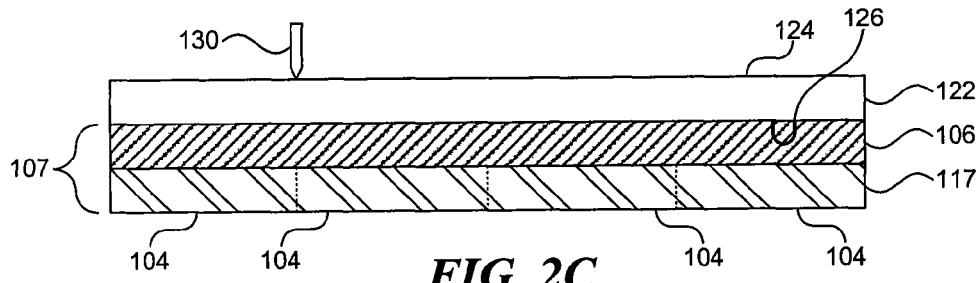

FIG. 2B shows the wafer 122 after the first adhesive 106 has been applied onto the second wafer surface 126. The first adhesive 106 can be applied by spraying, printing, pressing, or another suitable technique. Referring to FIG. 2C, a support structure 117 is attached to the first adhesive 106 to bind with the semiconductor wafer 122. The support structure 117 imparts rigidity to the semiconductor wafer 122 and protects the second wafer surface 126 of the wafer 122. In another embodiment, a preformed die attach film 107 having the first adhesive 106 and the support structure 117 can be applied to the second surface 126 of the semiconductor wafer 122 before cutting.

Figure 2D:
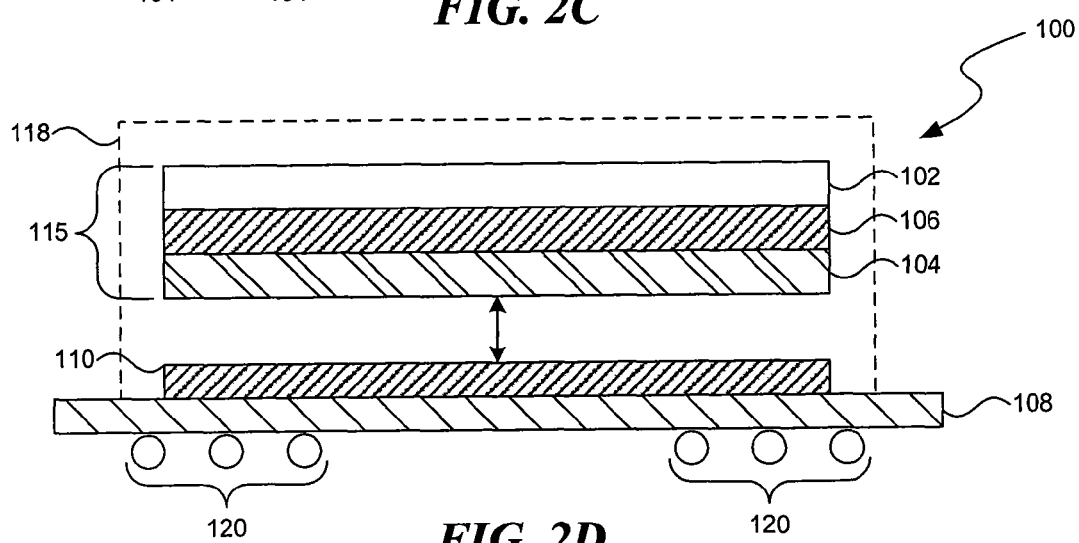

The semiconductor wafer 122 and the support structure 117 can then be cut into individual semiconductor subassemblies 115 using a saw blade 130, a laser, or any other suitable cutting techniques. Individual subassemblies 115 can accordingly include the die 102 with the attached support member 104. The support member 104 is a portion of the overall support structure 117. As shown in FIG. 2D, individual subassemblies 115 can then be attached to the substrate 108 with the second adhesive 110 and encased with the encapsulant 118 (shown in phantom lines for clarity). In certain embodiments, the subassemblies 115 can also be pre-encapsulated with an encapsulant either similar to or different from the encapsulant 118, coated with a protective coating (not shown), cleaned, washed, and/or otherwise processed before being attached to the substrate 108. In other embodiments, the wafer 122 can be cut into individual dies 102 (e.g., singulated) without first being attached with the support structure 117, and individual support member 104 can be attached to individual dies 102 after singulation.

Several embodiments of the support structure 117 can reduce chipping on the second wafer surface 126 by reinforcing the semiconductor wafer 122 against bending, twisting, or otherwise flexing during cutting. Without being bound by theory, it is believed that contacting the semiconductor wafer 122 with the saw blade 130 can cause micro-cracks in the semiconductor wafer 122. These micro-cracks can then propagate and join together to form chips along the kerb of the cut. If the semiconductor wafer 122 warps due to its reduced thickness, the warpage can exacerbate the propagation of the micro-cracks and thus cause increased chipping of the semiconductor wafer 122. As a result, reinforcing the semiconductor wafer 122 with the substantially rigid support structure 117 can reduce the amount of warping and chipping during singulation.

Moreover, several embodiments of the support member 104 can at least partially equalize heat dissipation from various regions of the die 102 when the die is operated. During operation, different regions of the die 102 can have different operating temperatures. For example, regions having logic circuits tend to consume more power than regions having memory elements and thus generate more heat to cause higher operating temperatures. Such temperature variations can cause the packaged component 100 to fail due to thermal stresses. Thus, supporting the die 102 with a support member 104 constructed from a metal, a metal alloy, or other material with sufficient heat conductivity can at least partially equalize the temperatures of different regions of the die 102 and thus improve robustness of the packaged component 100.

Further, several embodiments of the support member 104 can improve the durability of the packaged component 100 during thermal cycling. During thermal cycling, the die 102 can flex because the die 102 typically has a different coefficient of thermal expansion than the first and/or second adhesives 106, 110. The flexing of the die 102 can crack the die 102 and/or detach the die 102 from the substrate 108. Thus, the substantially rigid support member 104 can at least reduce such flexing and thus improve durability of the packaged component 100 during thermal cycling.

Even though the illustrated embodiments described above use adhesives to attach the support member 104 to the die 102 and to the substrate 108, in other embodiments, the support member 104, the die 102, and/or the substrate 108 can be bonded using mechanical fasteners, direct solid-solid bonding techniques, or other fastening techniques. In other embodiments, the support member 104 can be a moldable material (e.g., a resin), and the support member 104 can be attached to the die 102 without an adhesive by first disposing a layer of the moldable material in a molten state on the die 102 and subsequently solidifying the moldable material to form a substantially rigid structure. In further embodiments, the moldable material can at least partially encase the die 102.

FIG. 3 is a schematic side cross-sectional view of another example of the packaged semiconductor component assembly 100. Certain aspects of this example and others described herein, are at least generally similar to previously-described examples, and accordingly common acts and structures are identified by the same reference numbers. For purposes of brevity, only selected differences between this example and previous examples are described below. This example, more specifically, is a board-on-chip configuration, in which the semiconductor die 102 includes bond pads 112 located toward a central region of the first surface 105a of the die 102, instead of toward the edges of the semiconductor die 102. The first adhesive 106 attaches the support member 104 to the first surface 105a of the semiconductor die 102, and the second adhesive 110 attaches the support member 104 to the substrate 108. The support member 104, the adhesives 106, 110, and the substrate 108 include apertures that are generally aligned to form an opening 119 that is generally aligned with the centrally located bond pads 112. The opening 119 can allow the wirebonds 116 to electrically connect the bond pads 212 to the connection sites 114 on the second surface of the substrate 108. The encapsulant 118 fills the opening 119 and covers the wirebonds 116. In another version of the board-on-chip configuration, the support member 104 can be attached to the second surface 105b of the die 102, and the first surface 105a is attached directly to the substrate 108 with the second adhesive 110. In this case, the support member 104 does not include an aperture.

Figure 4:
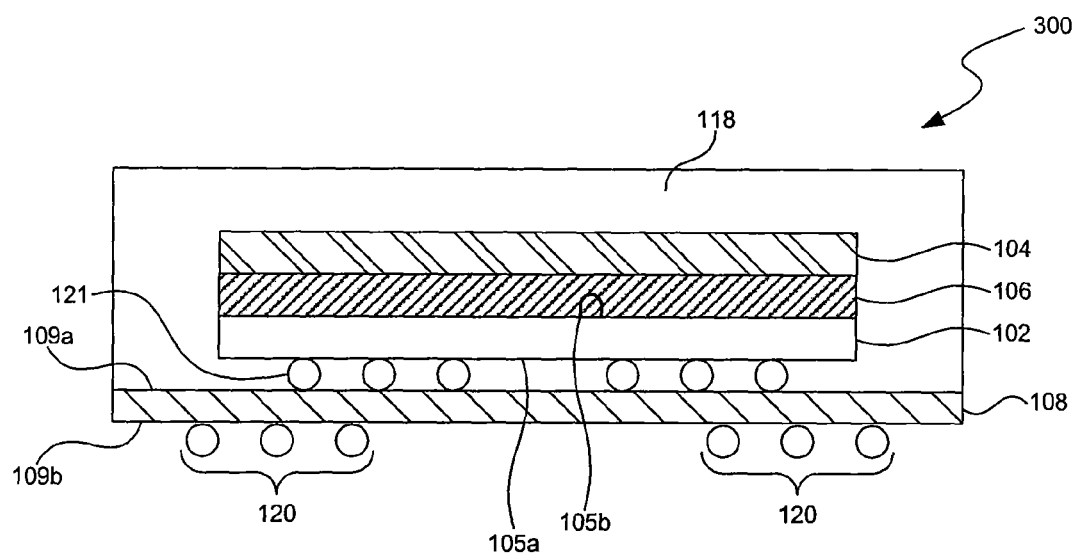
FIG. 4 is a schematic side cross-sectional view of a packaged semiconductor component in accordance with a further embodiment of the disclosure.

FIG. 4 is a schematic side cross-sectional view of another embodiment having a flip-chip arrangement. In this example, a plurality of internal solder balls 121 are disposed between the first surface 105a of the semiconductor die 102 and the first surface 109a of the substrate 108 to electrically connect integrated circuits (not shown) in the semiconductor die 102 to the substrate 108. The second adhesive 110 (FIG. 3) is omitted. The first adhesive 106 attaches the support member 104 to the second surface 105b of the semiconductor die 102.

Figure 5:
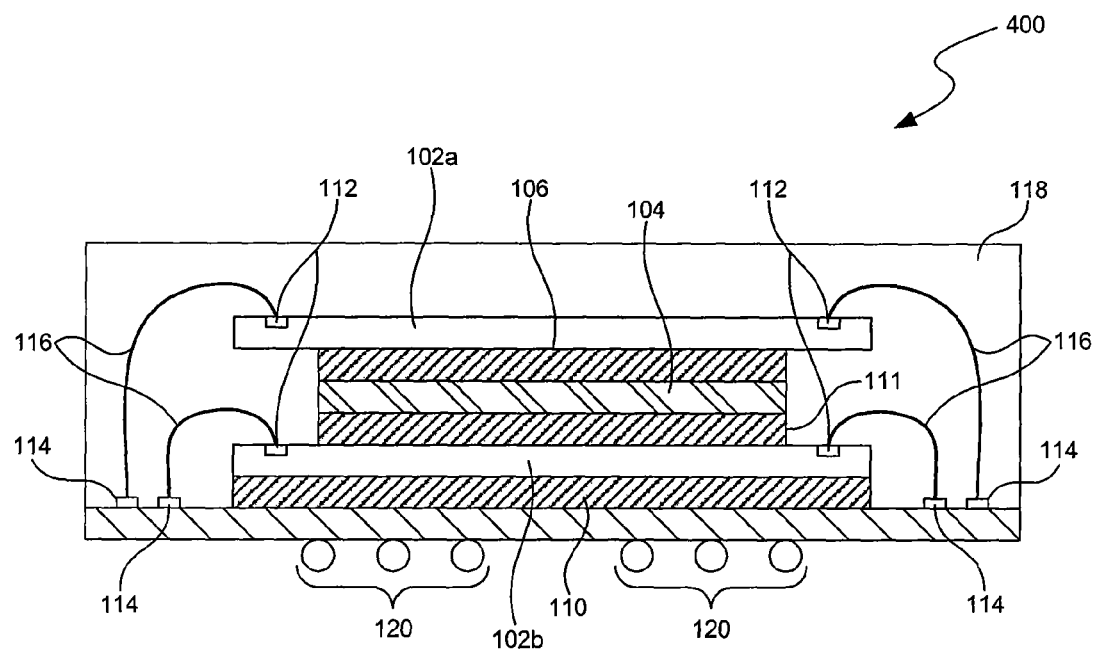
FIG. 5 is a schematic side cross-sectional view of a packaged semiconductor component having stacked semiconductor dies in accordance with an embodiment of the disclosure.

FIG. 5 is a schematic side cross-sectional view of a packaged semiconductor component 400 having stacked semiconductor dies 102a-b in accordance with an embodiment of the disclosure. The semiconductor dies 102a-b can be generally similar to the semiconductor die 102 in FIG. 1. The support member 104 separates the first die 102a and the second die 102b in a spaced apart arrangement. The first adhesive 106 attaches the support member 104 to the first die 102a, and the second adhesive 110 attaches the second die 102b to the substrate 108. The package 400 can also have a third adhesive 111 attaching the support member 104 to the second die 102b, and wirebonds 116 electrically connecting the bond pads 112 of the first and second dies 102a-b to connection sites 114 located on the substrate 108.

In one embodiment, the support member 104 is a metal (or metal alloy) spacer having a thickness sufficient to allow the bond pads 112 of the first and second dies 102a-b to be wirebonded to the connection sites 114. The metal spacer can reduce manufacturing costs for packaging semiconductor dies compared to conventional silicon spacers that are typically used to provide clearance between the first and second dies 102a-b. More specifically, the silicon spacers can be relatively expensive to manufacture and are relatively brittle. Thus, replacing the silicon spacer with a metal spacer can reduce the unit cost of the packaged semiconductor component 400 and provide a more robust package. Further, the metal spacer can improve heat dissipation of the first and/or second semiconductor dies 102a-b because the metal spacer typically has a higher heat conductance than a silicon spacer.

FIG. 6 is a flow chart of an embodiment of a method 600 for manufacturing semiconductor components. The method 600 includes forming integrated circuits on a semiconductor wafer (Block 610), and removing material from a surface of the semiconductor wafer (Block 620). The method 600 continues by attaching a support structure to the semiconductor wafer (Block 630). The support structure is at least substantially rigid and has a thickness that allows for easy cutting. Particular techniques for attaching the support structure to the wafer can be selected based on the particular application. The method 600 also includes cutting the semiconductor wafer and the attached support structure into individual dies and attached support members (Block 640). Individual semiconductor subassemblies having a semiconductor die and a portion of the substantially rigid support structure are thus formed after cutting through the wafer and the support structure. In other embodiments, the semiconductor wafer and the support structure can be separately pre-cut into individual dies and support members before the support member is attached to a corresponding die.

FIG. 7 is a flow chart of an embodiment of a method 700 for packaging semiconductor components. The method 700 includes attaching a semiconductor die and a support member attached to the semiconductor die to a substrate (Block 710). Adhesives or other suitable fasteners can be used to attach the semiconductor die and the support member to the substrate. The support member is at least substantially rigid. The method also include electrically connecting individual bond pads at the semiconductor die to individual connection sites at the substrate (Block 720). For example, wirebonds or a plurality of solder balls can electrically connect individual bond pads at the semiconductor die to individual connection sites at the substrate. The method 700 also includes encasing the semiconductor die and the support member in an encapsulant (Block 730) using, for example, injection molding or other suitable encasing techniques.

Any one of the semiconductor components described above with reference to FIGS. 1 and 3-5 can be incorporated into any of a myriad of larger and/or more complex systems, a representative example of which is system 800 shown schematically in FIG. 8. The system 800 can include a processor 801, a memory 802 (e.g., SRAM, DRAM, flash, and/or other memory device), input/output devices 803, and/or other subsystems or components 804. The foregoing semiconductor components described above with reference to FIGS. 1 and 3-5 can be included in any of the components shown in FIG. 8. The resulting system 800 can perform any of a wide variety of computing, processing, storage, sensing, imaging, and/or other functions. Accordingly, representative systems 800 include, without limitation, computers and/or other data processors, for example, desktop computers, laptop computers, internet appliances, hand-held devices (e.g., palm-top computers, wearable computers, cellular or mobile phones, personal digital assistants, etc), multi-processor systems, processor-based or programmable consumer electronics, network computers, and mini computers. Other representative systems 800 include cameras, light or other radiation sensors, servers and associated server subsystems, display devices, and/or other memory devices. In such systems, individual dies can include imager arrays, such as CMOS imagers. Components of the system 800 can be housed in a single unit or distributed over multiple, interconnected units (e.g., through a communications network). The components of the system 800 can accordingly include local and/or remote memory storage devices, and any of a wide variety of computer readable media.

From the foregoing, it will be appreciated that specific embodiments of the invention have been described herein for purposes of illustration, but that various modifications can be made without deviating from the inventions. For example, the packaged semiconductor component 100 in FIG. 3 can include an additional support member that is attached to the second surface 105b of the die 102. Certain aspects of the invention described in the context of particular embodiments may be combined or eliminated in other embodiments. For example, the packaged semiconductor packages described with reference to FIGS. 1, 3, and 4 can also include more than one dies attached to one or more support members. Additionally, where the context permits, singular or plural terms can also include plural or singular terms, respectively. Moreover, unless the word "or" is expressly limited to mean only a single item exclusive from the other items in reference to a list of two or more items, then the use of "or" in such a list means including (a) any single item in the list, (b) all of the items in the list, or (c) any combination of the items in the list. Additionally, the term "comprising" is used throughout the following disclosure to mean including at least the recited feature(s) such that any greater number of the same feature and/or additional types of features or components is not precluded. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. A packaged semiconductor component, comprising:
   a semiconductor die having a bond pad, a first composition, and a first width;
   a support member proximate to the semiconductor die, the support member being at least substantially rigid and having a second width generally equal to the first width and a second composition different from the first composition of the semiconductor die, wherein the support member includes a first plate, a second plate, and a plurality of heat conducting fins between the first and second plates;
   a first adhesive attaching the semiconductor die to the support member;
   a substrate having a connection site and carrying the semiconductor die and the support member attached to the semiconductor die;
   a second adhesive attaching the support member to the substrate;
   a wirebond extending between the bond pad of the semiconductor die and the connection site of the substrate; and
   an encapsulant at least partially encasing the semiconductor die, the support member, the first adhesive, the second adhesive, the wirebond, and the substrate.

2. The packaged semiconductor component of claim 1 wherein the support member is a plate constructed from at least one of a metal, a metal alloy, ceramics, polymers, and glass.

3. The packaged semiconductor component of claim 1 wherein the support member is a laminated structure having one at least substantially rigid layer.

4. The packaged semiconductor component of claim 1 wherein the semiconductor die further includes an array of photo sensors positioned at or near the a surface of the semiconductor die.

5. The packaged semiconductor component of claim 4, further comprising a glass member disposed adjacent to the array of photo sensors positioned at or near the surface of the semiconductor die.

6. The packaged semiconductor component of claim 1 wherein the support member and the first adhesive are preformed into a die attach film.

7. The packaged semiconductor component of claim 1 wherein the semiconductor die has a first surface and a second surface opposite the first surface, and wherein the bond pad is located on or near the first surface, and wherein the support member is attached to the second surface of the semiconductor die.

8. A packaged semiconductor component, comprising:
   a semiconductor die having a bond pad at a first die surface and a second die surface opposite the first die surface, the semiconductor die having a first width;
   a support member proximate to the semiconductor die, the support member including a plate having a second width generally equal to the first width and constructed from a metal and/or a metal alloy and having a composition different from a composition of the semiconductor die, wherein the support member includes a first plate, a second plate, and a plurality of heat conducting fins between the first and second plates;
   a first adhesive directly between the second die surface of the semiconductor die and the support member;
   a substrate having a connection site at a first substrate surface and a second substrate surface opposite the first substrate surface;
   a second adhesive directly between the support member and the first substrate surface of the substrate;
   a wirebond extending between the bond pad of the semiconductor die and the connection site of the substrate;
   an encapsulant at least partially encasing the semiconductor die, the support member, the first adhesive, the second adhesive, the wirebond, and the substrate; and
   a plurality of solder balls attached to the second substrate surface of the substrate.

9. The packaged semiconductor component of claim 8 wherein the support member does not include a semiconductor die.

10. The packaged semiconductor component of claim 8 wherein the support member has a rigidity sufficient to at least partially resist flexing during thermal cycling.

11. The packaged semiconductor component of claim 8 wherein the support member has a heat conductivity sufficient to at least partially equalize heat transfer from the semiconductor die during operation.

12. The packaged semiconductor component of claim 8 wherein the support member has a thickness of about 100 microns to about 3 mm.

13. A packaged semiconductor component, comprising:
- a semiconductor die having a plurality of bond pads at a first die surface and a second die surface opposite the first die surface, the semiconductor die having a first width;
- a substantially rigid plate proximate to the semiconductor die, the plate having a first plate surface proximate to the semiconductor die and a second plate surface opposite the first plate surface, the plate having a second width generally equal to the first width and a thickness of about 100 microns to about 3 mm, the plate being constructed from at least one of a metal, a metal alloy, ceramics, polymers, and glass, wherein the plate includes a first plate, a second plate, and a plurality of heat conducting fins between the first and second plates;
- a first adhesive directly between the first plate surface of the plate and the second die surface of the semiconductor die;
- a substrate carrying the semiconductor die and the plate, the substrate having a plurality of connection sites at a first substrate surface and a second substrate surface opposite the first substrate surface, the substrate having a third width larger than the first and second widths;
- a second adhesive directly between the second plate surface of the plate and the first substrate surface of the substrate;
- a plurality of wirebonds individually extending between the bond pads of the semiconductor die and the connection sites of the substrate;
- an encapsulant at least partially encapsulating the semiconductor die, the plate, the first adhesive, the second adhesive, the wirebonds, and the substrate; and
- a plurality of solder balls attached to the second substrate surface of the substrate.

14. The packaged semiconductor component of claim 13 wherein the semiconductor die further includes an array of photo sensors positioned at or near the first die surface of the semiconductor die.

15. The packaged semiconductor component of claim 13 wherein the semiconductor die further includes an array of photo sensors positioned at or near the first surface of the semiconductor die, and wherein the encapsulant includes an opening generally corresponding to the array of photo sensors, and further wherein the packaged semiconductor component includes a glass member in the opening of the encapsulant and adjacent to the array of photo sensors positioned at or near the first die surface of the semiconductor die.

* * * * *

UNITED STATES PATENT AND TRADEMARK OFFICE
CERTIFICATE OF CORRECTION

| | | |
|---|---|---|
| PATENT NO. | : 7,750,449 B2 | Page 1 of 1 |
| APPLICATION NO. | : 11/685502 | |
| DATED | : July 6, 2010 | |
| INVENTOR(S) | : Matt E. Schwab et al. | |

It is certified that error appears in the above-identified patent and that said Letters Patent is hereby corrected as shown below:

In column 8, line 16, in Claim 4, delete "the a" and insert -- the --, therefor.

Signed and Sealed this

Thirty-first Day of August, 2010

David J. Kappos
*Director of the United States Patent and Trademark Office*